United States Patent [19]

Thomas et al.

[11] Patent Number: 4,486,526
[45] Date of Patent: Dec. 4, 1984

[54] LITHOGRAPHIC PLATE AND PHOTORESIST HAVING PHOTOSENSITIVE LAYERS OF DIAZO AND CINNAMOYLATED PHENOL-BLOCKED ISOCYANATE POLYURETHANE MATERIALS

[75] Inventors: Daniel C. Thomas, Wheaton, Ill.; Jack L. Sorkin, University Heights, Ohio

[73] Assignee: Richardson Graphics Company, Des Plaines, Ill.

[21] Appl. No.: 501,750

[22] Filed: Jun. 9, 1983

Related U.S. Application Data

[63] Continuation of Ser. No. 352,071, Feb. 25, 1982, abandoned, which is a continuation of Ser. No. 198,363, Oct. 20, 1980, Pat. No. 4,330,611, which is a continuation of Ser. No. 000,168, Jan. 2, 1979, abandoned, which is a continuation of Ser. No. 870,197, Jan. 17, 1978, Pat. No. 4,133,685, which is a continuation of Ser. No. 755,932, Dec. 30, 1976, abandoned, which is a continuation of Ser. No. 541,455, Jan. 16, 1975, abandoned, which is a continuation-in-part of Ser. No. 435,340, Jan. 21, 1974, abandoned, which is a continuation of Ser. No. 829,149, May 29, 1969, Pat. No. 3,808,004.

[51] Int. Cl.³ .................... G03C 1/52; G03C 1/68; G03F 7/08
[52] U.S. Cl. .................... 430/156; 430/168; 430/169; 430/271; 430/273; 430/275; 430/284; 430/287; 430/302; 430/325; 430/906; 430/323
[58] Field of Search ............... 430/156, 168, 169, 287, 430/284, 302, 271, 273, 275, 906, 323, 325; 525/455; 528/45, 75

[56] References Cited

U.S. PATENT DOCUMENTS

| 2,610,120 | 9/1952 | Minsk et al. | 96/115 R |
|---|---|---|---|
| 2,728,745 | 12/1955 | Smith et al. | 430/284 |
| 3,030,208 | 4/1962 | Schellenberg et al. | 96/115 R |
| 3,136,637 | 6/1964 | Larson | 96/75 |
| 3,173,787 | 3/1965 | Clement et al. | 96/36.3 |
| 3,257,664 | 6/1966 | Leubner et al. | 430/287 |
| 3,357,831 | 12/1967 | Wu | 96/115 R |
| 3,376,139 | 4/1968 | Giangualano et al. | 96/36 |
| 3,387,976 | 6/1968 | Sorkin | 96/35.1 |
| 3,462,267 | 8/1969 | Giangualano et al. | 96/75 |
| 3,622,320 | 11/1971 | Allen | 96/115 R |
| 3,622,331 | 11/1979 | Thomas | 96/68 |
| 3,652,272 | 3/1972 | Thomas | 96/33 |
| 3,655,625 | 4/1972 | Thomas | 430/524 |
| 3,808,004 | 4/1974 | Thomas et al. | 96/75 |
| 4,063,953 | 12/1977 | Fukutani et al. | 430/287 |
| 4,133,685 | 1/1979 | Thomas et al. | 96/75 |

FOREIGN PATENT DOCUMENTS

| 794572 | 5/1958 | United Kingdom | 96/115 R |
|---|---|---|---|
| 913764 | 12/1962 | United Kingdom | 96/115 R |
| 921530 | 3/1963 | United Kingdom | 96/115 R |

OTHER PUBLICATIONS

Kosar, J., "Light Sensitive Systems", Wiley & Sons, 1965, p. 137.

Primary Examiner—Charles L. Bowers, Jr.
Attorney, Agent, or Firm—Lockwood, Alex, Fitzgibbon & Cummings

[57] ABSTRACT

A photopolymerizable coating over a diazo resin provides a high-speed lithographic plate or photoresist while improving the printing life of the plate while making its development simpler than that of most other photopolymer plates. The photopolymer is a cinnamoylated resin which is placed over a diazo based material.

2 Claims, No Drawings

LITHOGRAPHIC PLATE AND PHOTORESIST HAVING PHOTOSENSITIVE LAYERS OF DIAZO AND CINNAMOYLATED PHENOL-BLOCKED ISOCYANATE POLYURETHANE MATERIALS

CROSS REFERENCE TO RELATED APPLICATIONS

This application is a continuation of copending application Ser. No. 352,071, filed Feb. 25, 1982, now abandoned, which is a continuation application of Ser. No. 198,363, filed Oct. 20, 1980 and issued to U.S. Pat. No. 4,330,611 on May 18, 1982, which is a continuation of application Ser. No. 000,168, filed Jan. 2, 1979, now abandoned, which is a continuation of application Ser. No. 870,197, filed Jan. 17, 1978 and issued to U.S. Pat. No. 4,133,685 on Jan. 9, 1979, which is a continuation of application Ser. No. 755,932, filed Dec. 30, 1976, now abandoned, which is in turn a continuation of application Ser. No. 541,455, filed Jan. 16, 1975, now abandoned, which is a continuation-in-part application of application Ser. No. 435,340, filed Jan. 21, 1974, now abandoned which is in turn a continuation of application Ser. No. 829,149, filed May 29, 1969 and issued as U.S. Pat. No. 3,808,004 on Apr. 30, 1974.

INCORPORATION BY REFERENCE

This application incorporates by specific reference U.S. Pat. No. 3,808,004 issued Apr. 30, 1974, having Daniel C. Thomas and Jack L. Sorkin as inventors and assigned to the Richardson Graphics Company, Chicago, Ill. Said patent is based on Application Ser. No. 829,149 filed May 29, 1969.

An abstract of said reference follows:

In such patent a photopolymerizable coating over a diazo resin is used to provide high-speed lithographic plate or a photoresist while also improving the run length of the plate incorporating the combination. Additionally, improved development of the plate occurs. The photopolymer comprises a cinnamoylated resin.

A brief summary of the referenced patent follows:

The invention of said referenced patent generally resides in a two layer lithographic or photoresist plate in which a cinnamoylated photopolymer is placed over a diazo resin base in order to engender the above stated advantageous properties.

There are no drawings in the referenced patent.

A representative claim in the referenced patent is as follows:

A high-speed presensitized plate for lithography or photoresist etching comprising in combination, a plate base, a sub-base coating over the plate base, a light sensitive diazo resin condensation product of an aldehyde and a diazonium compound layer over the sub-base coating and a phenoxy cinnamate photopolymer coating over the diazo resin layer.

Regarding the present invention, an Example 7 of the referenced patent lithograph printing plates were made with either an alkyd resin or an aryl allyl ester resin placed over a diazo resin layer. Thereafter plates containing these resins were exposed and tested for bench and press results. The data in Example 7 indicate that the aryl allyl ester and diazo combination when exposed and developed in a standard method yielded a run length of about 35,000 copies.

Compared to the present invention (cinnamoylated polyvinyl alcohol polymer over a diazo resin) the system of an aryl allyl ester over diazo resin was inferior as illustrated by the reported data for plates 28b, 28c, 28d, 29b, 29c, 29d, 30b and 32b which showed an improved run length associated with the claimed system. More particularly, plate 28b showed that for a 10 second exposure over 110,000 copy run lengths could be attained. Compared to the 35,000 copy run length for the aryl allyl ester over a diazo resin, a substantial improvement was realized.

The degree of cinnamoylation of the polyvinyl alcohol resin, as shown by the above data, reflects the degree of improvement achieved regarding press test run lengths. More particularly, plates 28c, 28d and 29b, which were essentially 100% cinnamoylated, had run lengths for exposure times varying from 10 seconds to 2 minutes of all over 100,000 copies. This illustrates, more particularly, the improved results for the claimed invention especially when compared to the aryl allyl ester system.

Regarding other aspects of this invention, other photopolymers can be used as overcoatings; namely, Vinyl chloride-Vinyl Acetate disclosed in Example 3 and in Nos. 13b, 15a, 15b, 19b, 19c, 20b, and 21b of Example 8; Bisphenol-A Fumarate Polyester in Example 4 and Nos. 16, 17b, 18b, 18c, and 22b of Example 8; Polycarbonate in Example 5 and in Nos. 23, 24b, and 25b of Example 8; and Polyurethane in Example 6 and in Nos. 26 and 27b in Example 8 of U.S. Pat. No. 3,808,004.

We claim as our invention:

1. A high-speed presensitized plate for lithography or photoresist etching, including in combination a plate base, a sub-base coating over said plate base, a layer of a light sensitive diazo resin condensation product of an aldehyde and a diazonium compound over the sub-base coating and a cinnamate photopolymer coating over said diazo resin layer, wherein the photopolymer coating contains phenol-blocked isocyanate polyurethane cinnamate polymer.

2. A method of converting an unlacquered negative-working diazo resin lithographic or photoresist plate wherein the diazo resin is a light sensitive condensation product of an aldehyde and a diazonium compound to a high-speed negative-working lithographic or photoresist plate, which method comprises coating the diazo resin with a cinnamate photopolymer coating wherein said photopolymer coating comprises phenol-blocked isocyanate polyurethane cinnamate photopolymer, said method including unblocking said photopolymer by heating same.

* * * * *